United States Patent
Yagi (10) Patent No.: US 7,736,926 B2
(45) Date of Patent: Jun. 15, 2010

(54) METHOD FOR MANUFACTURING A LIGHT-EMITTING DEVICE WITH A PERIODIC STRUCTURE IN AN ACTIVE REGION

(75) Inventor: Hideki Yagi, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 415 days.

(21) Appl. No.: 11/790,486

(22) Filed: Apr. 25, 2007

(65) Prior Publication Data

US 2007/0253456 A1 Nov. 1, 2007

(30) Foreign Application Priority Data

Apr. 27, 2006 (JP) ............................. 2006-124153

(51) Int. Cl.
*H01L 21/00* (2006.01)
(52) U.S. Cl. ................................. 438/47; 257/E33.027
(58) Field of Classification Search .................. 438/44, 438/46, 47; 257/E33.023–E33.025, E33.027
See application file for complete search history.

(56) References Cited

U.S. PATENT DOCUMENTS 6,365,428 B1 * 4/2002 Zubrzycki et al. ............. 438/32

FOREIGN PATENT DOCUMENTS

| JP | 3-49284 | 3/1991 |
|----|---------|--------|
| JP | 3-49287 | 3/1991 |
| JP | 7-221392 | 8/1995 |
| JP | 10-270793 | 10/1998 |
| JP | 11-54835 | 2/1999 |
| JP | 2000-91303 | 3/2000 |
| JP | 2001-156391 | 6/2001 |
| JP | 2002-33305 | 1/2002 |
| JP | 2003-142773 | 5/2003 |
| JP | 2004-55797 | 2/2004 |

OTHER PUBLICATIONS

Notification of Reasons of Rejection.

* cited by examiner

*Primary Examiner*—W. David Coleman
*Assistant Examiner*—Sonya D McCall-Shepard
(74) *Attorney, Agent, or Firm*—Smith, Gambrell & Russell, LLP (57) ABSTRACT

The invention provides a light-emitting device, where the active region thereof may be escaped from being damaged by the plasma process. The device is first formed with a semiconductor layer on the semiconductor substrate, next provided with an etching mask. Using the mask, the semiconductor layer on the substrate is dry-etched to form a periodic structure with grooves and mesas. The active regions are buried within the grooves by the OMVPE method.

13 Claims, 12 Drawing Sheets

METHOD FOR MANUFACTURING A LIGHT-EMITTING DEVICE WITH A PERIODIC STRUCTURE IN AN ACTIVE REGION

BACKGROUND OF THE INVENTION

1. Field of the Invention

The present invention relates to a method for manufacturing a light-emitting device that provides a periodic structure along a direction to which the light is emitted.

2. Relater Prior Art

A laser diode with a distributed feedback structure has been well known as a DFB laser diode. To form the distributed feedback structure, a periodic undulation is induced in an active layer by dry-etching the active layer after the planar growth thereof. A Japanese Patent Application published as JP-2004-055797A has disclosed such manufacturing process for the DFB laser diode.

However, the dry-etching for the active region may induce plasma damage in the active region, which causes dislocations and defects to degrade the efficiency for emitting light due to non-radiative recombination centers brought by such imperfections in the lattice. Thus the threshold current of the laser diode increases.

SUMMARY OF THE INVENTION

One aspect of the present invention relates to a method for manufacturing a semiconductor light-emitting device with a distributed feedback (DFB) grating structure. The device comprises a semiconductor substrate, a plurality of semiconductor regions and a plurality of active regions. The semiconductor regions and the active regions are alternately arranged to form a periodic structure of a distributed feedback structure. The method according to the present has a feature that: (a) forming a semiconductor layer on a semiconductor substrate, (b) forming an etching-mask on the semiconductor layer, (c) dry-etching the semiconductor layer using the etching-mask to form a first periodic structure including a plurality of first grooves and a plurality of first mesas, and (d) selectively forming the active region so as to bury the plurality of grooves using the etching mask.

Because, the process according to the present invention selectively forms the active regions so as to bury the grooves formed by the dry-etching, the active regions may be escaped from the etching damaged caused by the dry-etching, which enhances the quality, namely, the performance and the reliability of the light-emitting device.

The active region may be a quantum well structure, a quantum wire structure and a quantum box structure with AlGaInAs. Moreover, each active region may accompany with a semiconductor layer, not containing aluminum, on a top thereof to prevent the oxidization of aluminum contained active region, which may further enhance the quality of the device.

Further, the device may include another grating structure that also provides a plurality of active regions and a plurality of semiconductor regions, each active region and semiconductor region is alternately arranged. The width of the active region in the other grating structure may be narrower than the width of the active regions in the first grating structure, which makes the other grating region operated as a distributed Bragg reflector for the light generated in the first grating region.

The method according to the present invention may form the other grating region simultaneously with the formation of the first grating region. That is, the process for dry-etching the semiconductor layer may be carried out by using the etching mask that provides patterns for the first grating and also for the other grating, and a subsequent process for burying the active region within etched grooves in the first grating and the other grating may be carried out at the same time. Thus, even a light-emitting device with a complex structure of the DFB structure for generating coherent light integrated with the DBR structure for reflecting light, the process according to the present invention may easily manufacture the device, which may reduce the cost and enhance the performance and the reliability of the device.

DESCRIPTION OF PREFERRED EMBODIMENTS

Next, preferred embodiments of the present invention will be described as referring to accompanying drawings. In the description, the same symbols or numerals will refer to the same elements without overlapping explanations.

Figure 1:
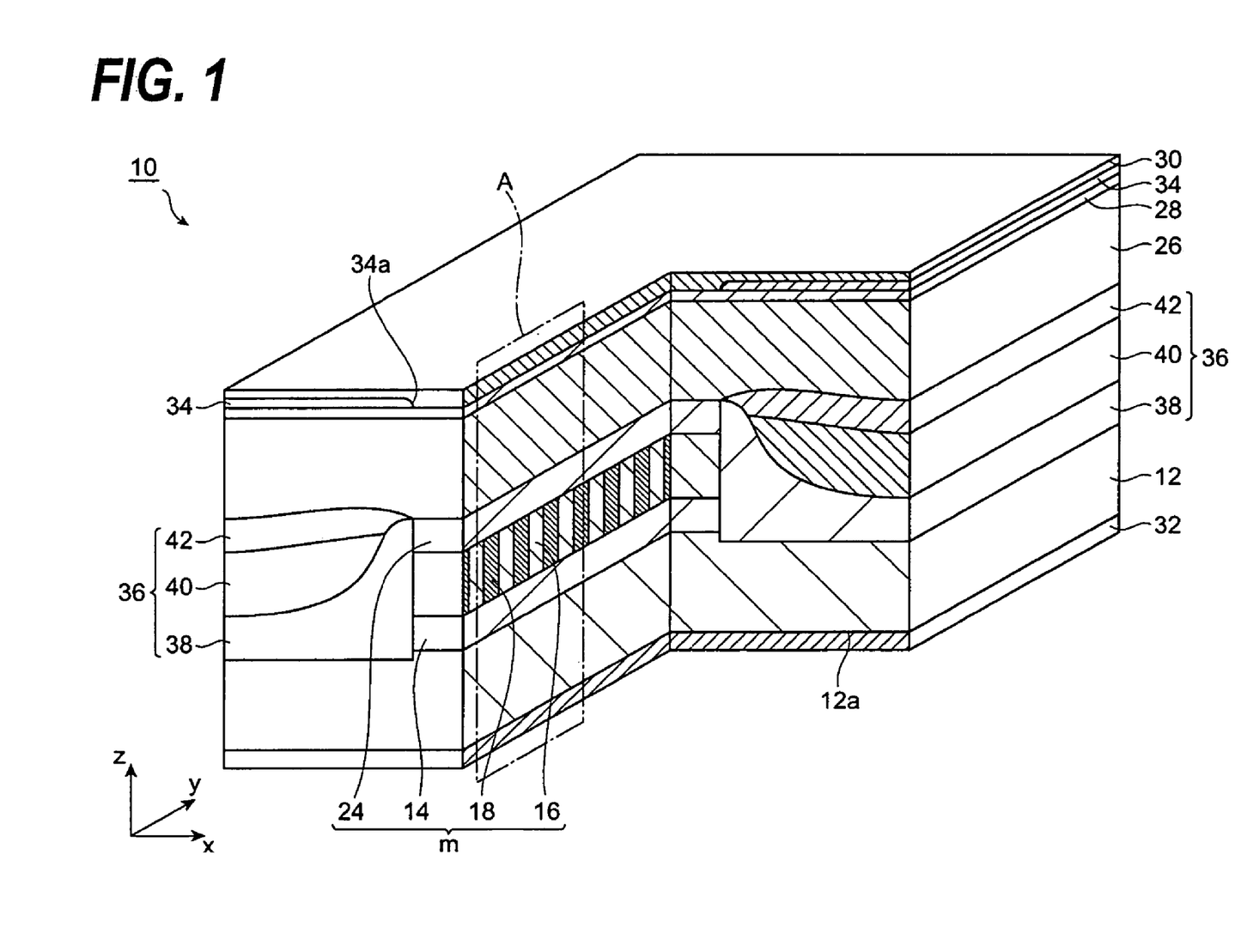
FIG. 1 is a perspective view of the light-emitting device according to an embodiment of the invention, a portion of which is cut away to show a cross section of the active region.

FIG. 1 is a perspective cross section of an exemplary semiconductor light-emitting device according to the present invention with the spatial co-ordinate. The light-emitting device 10 shown in FIG. 1 is a type of a distributed feedback (DFB) laser diode.

The device 10 includes a semiconductor substrate 12 made of group III-V compound semiconductor material with a first conduction type, for instance, the n-type, an active region 18 within a mesa structure m formed on the substrate 12, and a semiconductor layer 26 made of a group III-V compound semiconductor material with a second conduction type, for instance, the p-type, arranged on the active region. The substrate 12 and the semiconductor layer 26 may be InP. The substrate 12 includes a lower cladding layer 12, while, the semiconductor layer 26 may be an upper cladding layer with a doping concentration of $1 \times 10^{18}$ cm$^{-3}$. The mesa structure m is stacked along the z-direction while extends along the y-direction.

Between the substrate 12 and the active region 18 is put with an optical confinement layer 14, while, between the active regions 18 and the semiconductor layer 26 is put with another optical confinement layer 24 made of group III-V compound semiconductor material. These optical confinement layers, 14 and 24, are involved within the mesa structure m and may be GaInAsP with a doping concentration thereof about $5 \times 10^{17}$ cm$^{-3}$.

Between the optical confinement layers, 14 and 24, is put with semiconductor regions 16 made of another III-V compound semiconductor material, which is also involved within the mesa structure m. The active regions 18 and the semiconductor regions 16 are alternately arranged to each other along the y-direction to form an optical grating structure. The device 10 emits light to the y-direction. The semiconductor regions 16 may be i-GaInAsP or i-InP, where i means the intrinsic characteristic without the intentional doping.

The semiconductor layer 26 provides a contact layer 28 thereon. The contact layer 28 may be GaInAs with a doping concentration thereof about $1 \times 10^{19}$ cm$^{-3}$. On the contact layer 28 is provides with an electrode 30, which makes an ohmic contact thereto, through an opening 34a formed in an insulating layer 34. The opening 34a is arranged above the mesa structure m. The back surface 12a of the substrate 12 forms another electrode 32.

Between the substrate 12 and the semiconductor layer 26, the upper cladding layer, is formed with a buried region 36 so as to cover the sides of the mesa structure m. The buried region 36 includes a semiconductor layer 38 made of III-V group compound semiconductor material with the second conduction type formed on the substrate 12, a semiconductor layer 40 made of III-V group compound semiconductor material with the first conduction type, and a semiconductor layer 42 also made of III-V compound semiconductor material with the second conduction type.

Figure 2:
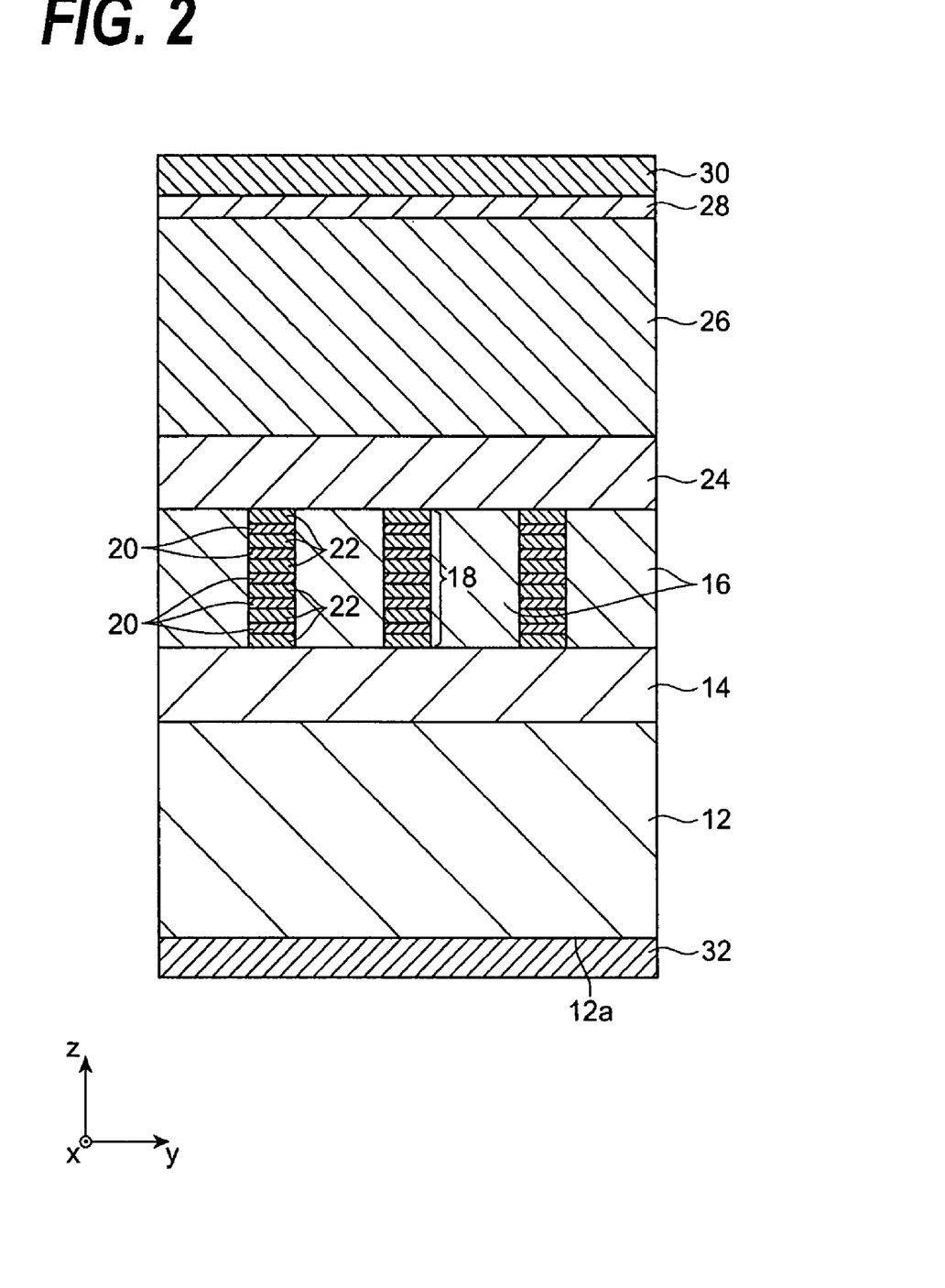
FIG. 2 magnifies the region A shown in FIG. 1.

FIG. 2 magnifies the region A in FIG. 1. As shown in FIG. 2, the active region 18 may include well layers 20 and barrier layers 22 each stacked alternately and with the different band gap energy. The well layers and the barrier layers 22 may be an i-GaInAsP. Thus, the active region 18 may provide a quantum well structure, a quantum wire structure or a quantum box structure. When the active region 18 provides the quantum well structure, the active region may be thickened by increasing the count of the stacking of the well and barrier layers. When the active region 18 provides the quantum wire or box structure, the device 10 may decrease the threshold current to emit light.

Second Embodiment

FIGS. from 3 to 7 schematically show processes for manufacturing the light-emitting device shown in FIG. 1. Next, respective processes shown in FIGS. from 3 to 7 will be described.

Growth of Group III-V Compound Semiconductor Layers)

Figure 3:
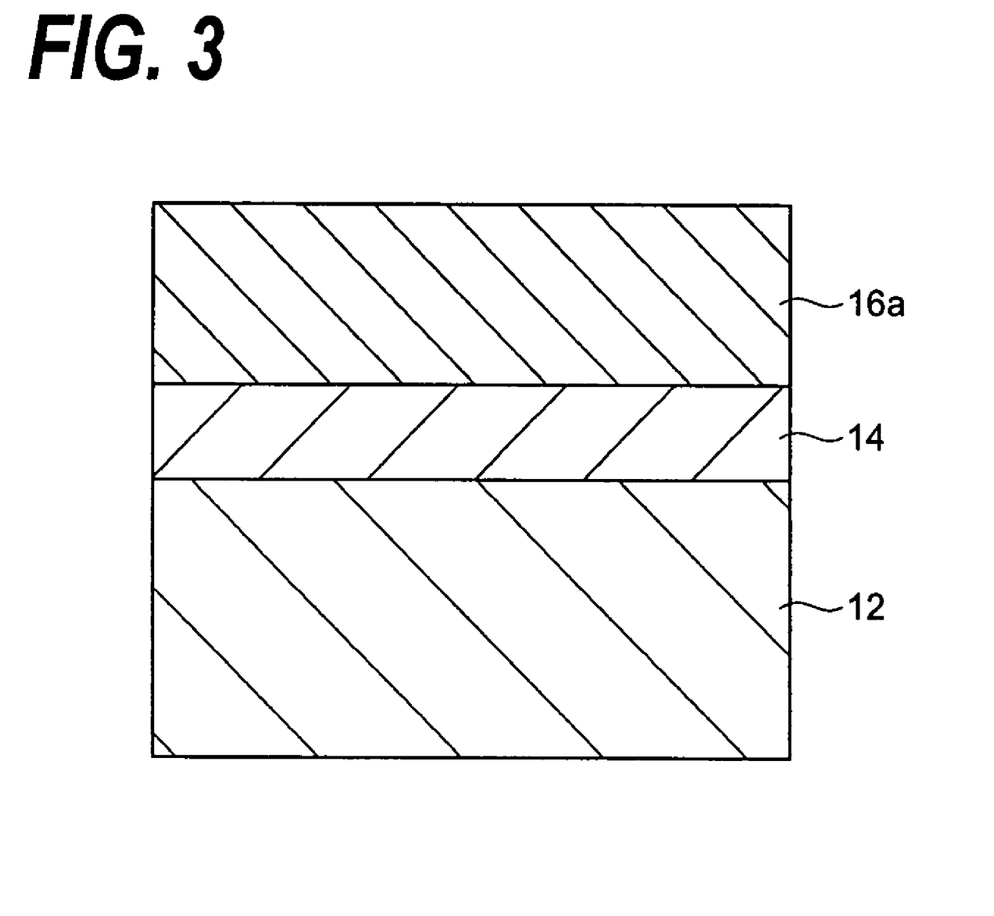
FIG. 3 shows a process for manufacturing the light-emitting device shown in FIG. 1.

First, a group III-V compound semiconductor layer 16a is grown on the substrate 12. The substrate 12 provides with the lower cladding layer. The lower optical confinement layer 14 may be grown, if necessary, on the substrate 12 prior to the growth of the semiconductor layer 16a. The MOVPE (Metal-Organic Vapor Phase Epitaxy) method may grow the layer 16a and the lower optical confinement layer 14. The growth temperature of these layers may be 650° C.

(Forming Etching Mask)

Figure 4:
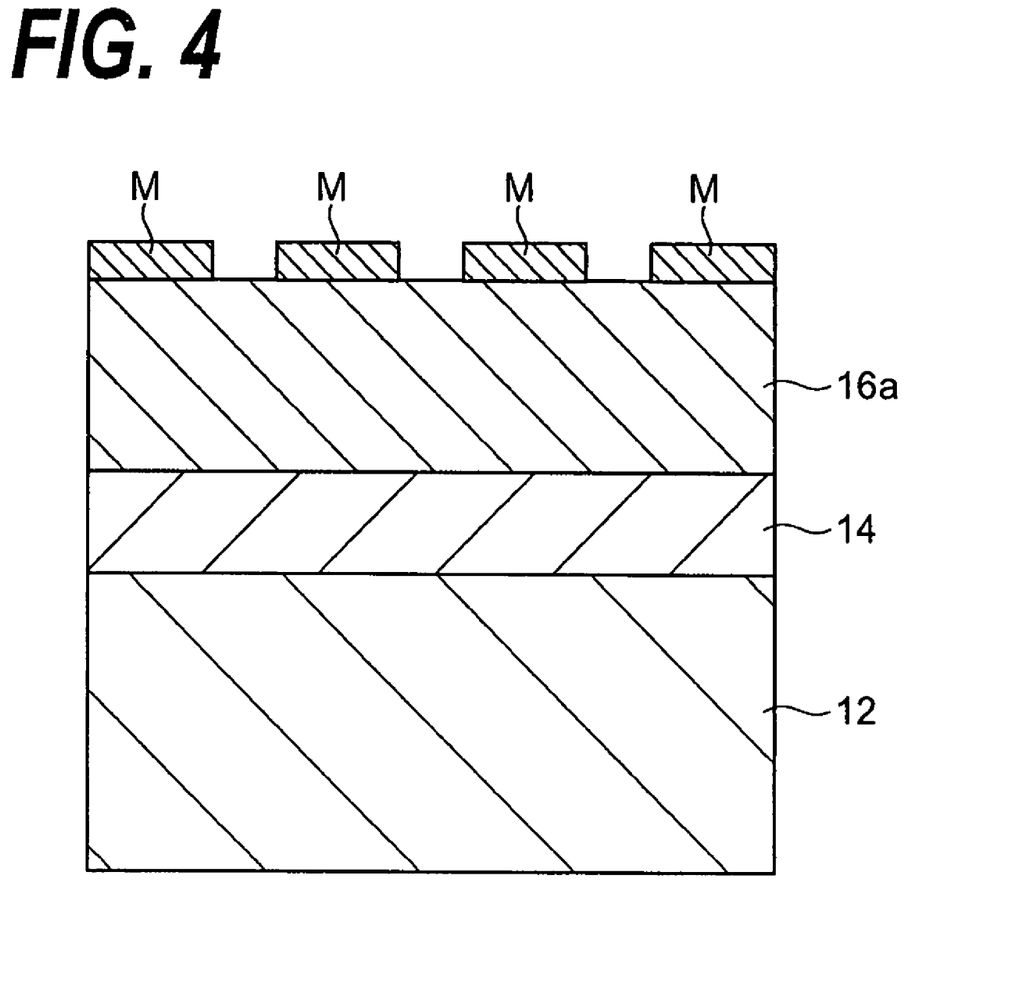
FIG. 4 shows a process, subsequent to the process shown in FIG. 3, for manufacturing the light-emitting device.

Next, an etching mask M is formed on the semiconductor layer 16, as shown in FIG. 4. The mask M may be made of silicon oxides and patterned with the lithography technique. For instance, a stacked semiconductor layers of the substrate 12, the lower confinement layer 14 and the semiconductor layer 16a forms a silicon dioxide layer, $SiO_2$, on the semiconductor layer 16a with a thickness thereof, for instance, 15 to 20 nm by the chemical vapor deposition (CVD) method. Subsequently, the $SiO_2$ layer forms a photo-resist with a thickness around 60 nm thereon. The photo-resist may mix the $C_{60}$ within a base material for the electron beam exposure, for instance, ZEP 520. Deposition of the resist film, the dry-etching of the $SiO_2$ layer using the $CF_4$ as an active gas, and the ashing of the resist by $O_2$ gaseous form the mask pattern M shown in FIG. 4.

(Dry-Etching)

Figure 5:
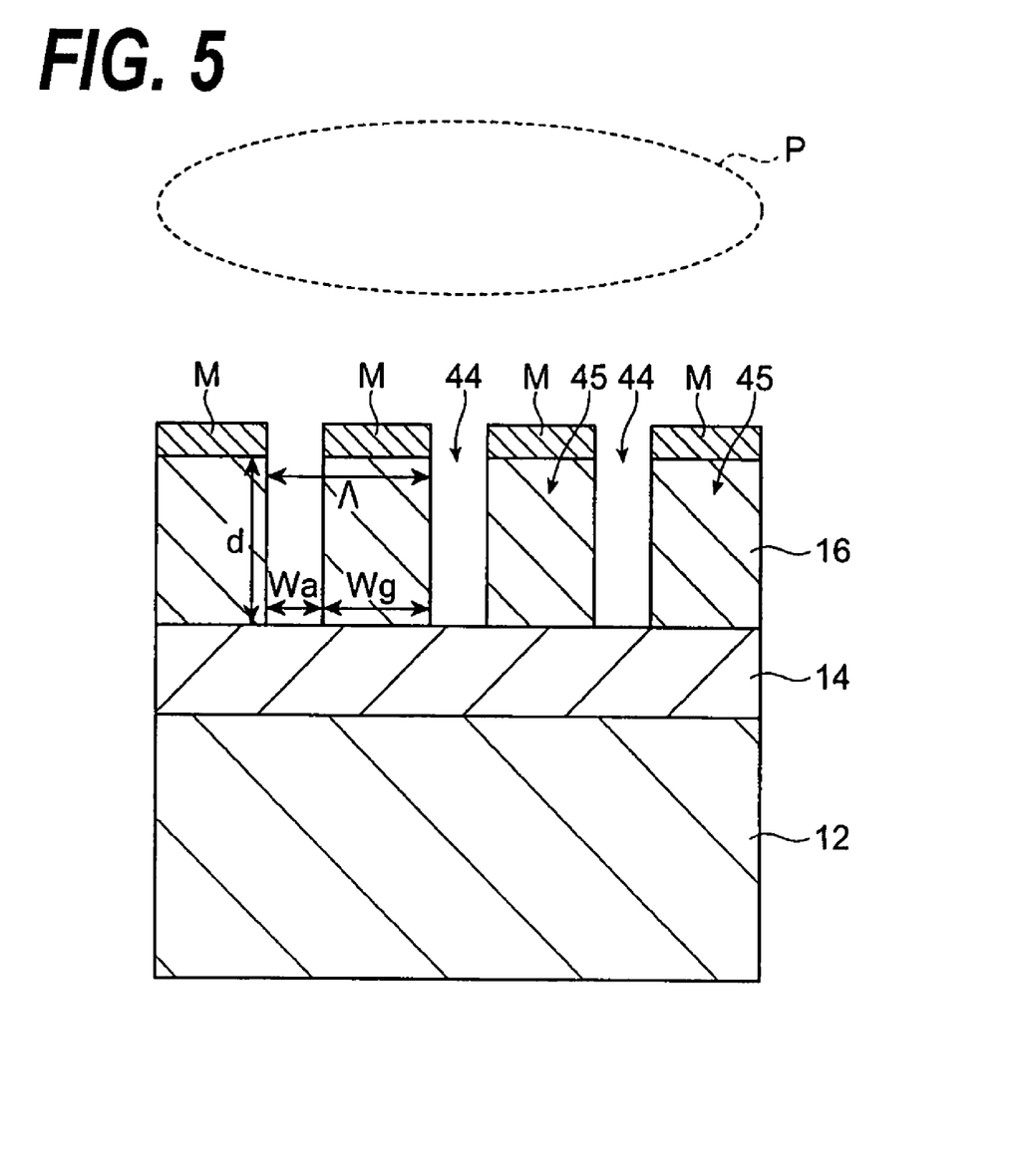
FIG. 5 shows a process, subsequent to the process shown in FIG. 4, for manufacturing the light-emitting device, where the semiconductor layer is dry-etched to form a periodic structure in the active region.

Subsequently, the semiconductor layer 16a is etched with the mask M, as shown in FIG. 5, to form the semiconductor region 16 with a plurality of grooves 44. Between the grooves 44 is left with mesas 45. The etching of the semiconductor layer 16a may be carried out by the reactive ion etching (RIE) within the gaseous plasma P.

When the semiconductor layer 16 contains indium (In) for the group III material and phosphorous (P) for the group V material, the dry-etching may be carried out by using a reactive gas including methane ($CH_4$) and hydrogen (H), which enhances the steepness of the sides of the mesas 45 as well as to suppress the damage caused by the plasma P to the mesas 45.

The flow rate of the hydrogen (H) may be three to five times greater than that of the methane ($CH_4$). Conditions of the dry etching of the semiconductor layer 16a, in an example thereof, are as follows:

TABLE I

| Conditions for Dry-Etching | |
|---|---|
| flow-rate of methane | 10 sccm |
| flow-rate of hydrogen | 40 sccm |
| reaction pressure | 6.5 Pa |
| Power density of electromagnetic wave | 0.2 W/cm$^2$ |

The ashing using $O_2$ gas is preferable to be carried out after the etching, which removes polymers reacted from the methane ($CH_4$). Conditions of the ashing are as follows in an embodiment:

TABLE II

| Conditions of Ashing | |
|---|---|
| flow rate of oxygen | 30 sccm |
| reaction pressure | 10 Pa |
| power density of electromagnetic wave | 0.1 W/cm$^2$ |

The width Wa of the groove 44 is preferable to be equal to or smaller than the width Wg of the mesas 45, which makes the width of the active region 18 narrow to enable to form the quantum wire and the quantum box as well as the quantum well structure.

The grooves 44 combined with the mesas 45 forms a optical grating with a preset pitch Λ for the device 10 to emit light with a longitudinally single mode. The pitch Λ is equivalent to that of the Bragg reflector and is equal to a sum of the width Wa of the groove 44 and that Wg of the rib 45. Assuming the wavelength of the light emitted from this device 10 is 1.3 μm, the pitch Λ becomes 200 nm, while, it is 240 nm for the wavelength of 1.55 μm. The depth d of the groove 44 is substantially equal to the thickness of the semiconductor layer 16a, which is preferably greater than 40 nm.

(Etching)

Figure 6:
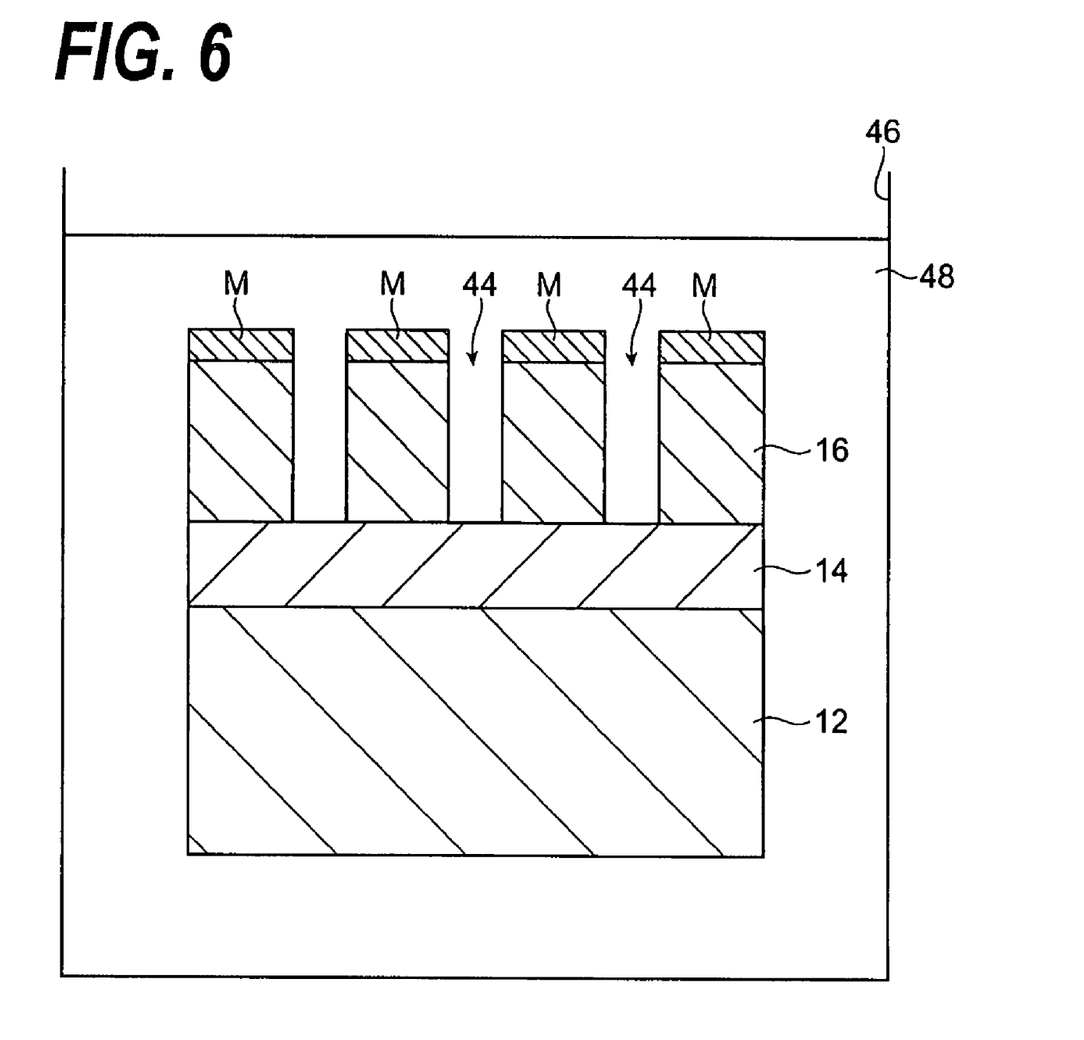
FIG. 6 shows a process, subsequent to the process shown in FIG. 5, for manufacturing the light-emitting device, in which the groove is slightly etched to smooth the surface thereof.

Next, the device under processing is wet-etched to smooth the grooves 44, which enhances the surface smoothness of the active region 18 buried within the grooves 44. For example, the device under processing is immersed within an etchant 48 in the bath 46 to smooth the grooves 44. The etchant 48 may be a sulfuric acid when the layer 16, the mesas 18, includes GaInAsP, while, it may be a hydrochloric acid for the case the layer 16 includes InP. In other process, the etchant including those acids may be sprayed in the layer 16.

(Burying Process)

Figure 7:
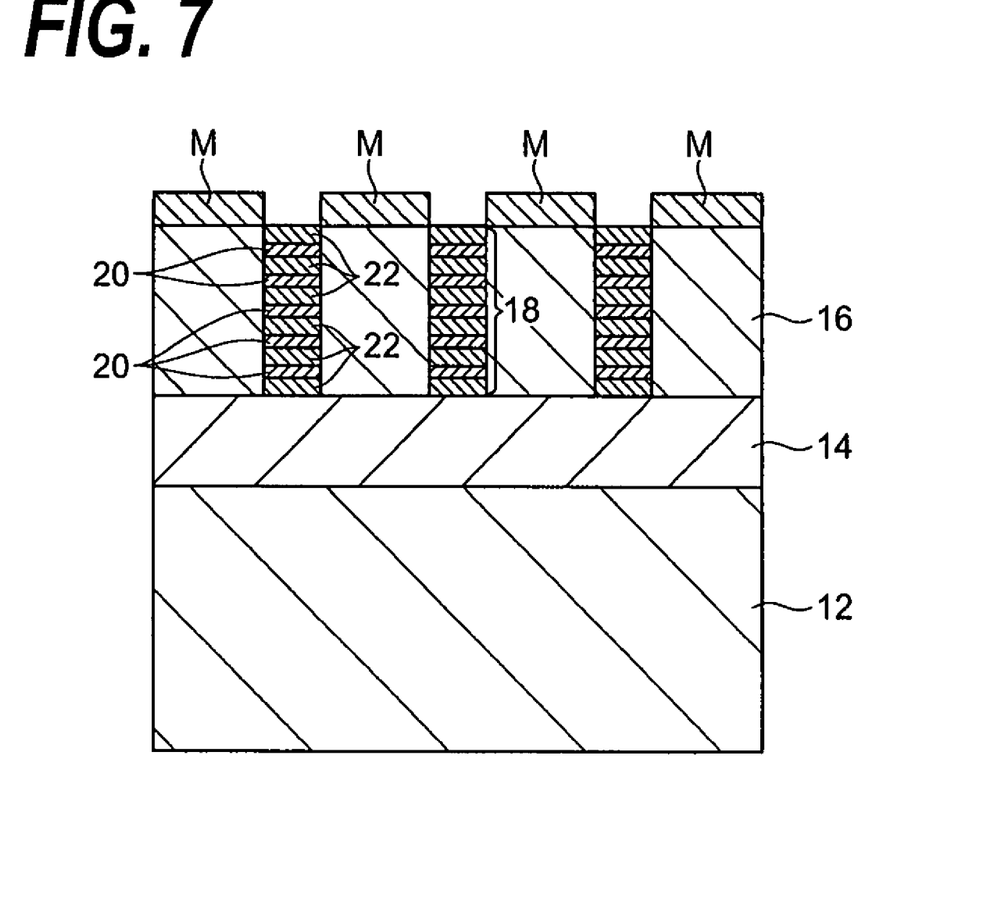
FIG. 7 shows a process, subsequent to the process shown in FIG. 6, for manufacturing the light-emitting device, where the active regions bury the grooves in the semiconductor layer.

As shown in FIG. 7, the subsequent process buries the active region 18 made of group III-V compound semiconductor material within the grooves 44 by using the mask M. This burying process may be carried out by the OMVPE method at a temperature of, for instance, 600° C., which shows a growth rate of 200 to 500 nm/hour.

The growth rate greater than 200 nm/hour, compared to a case for the rate smaller than 200 nm/hour, may reduce the concentration of contaminations taken within the active region. The rate smaller than 500 nm/hour, compared to the rate greater than 500 nm/hour, may enhance the flatness of the active region.

Further, because the process for burying the groove 44 uses the mask M, no semiconductor layers may be formed on the mask M, which enables, as shown later, to grow the upper optical confinement layer 24 directly on the semiconductor regions 16.

(Second Growth of Semiconductor Layers)

After removing the mask M, the process sequentially grows the upper optical confinement layer 24, the upper cladding layer 26 and the contact layer 28, as shown in FIG. 2. The buffered fluoric acid may remove the mask M made of silicon dioxide ($SiO_2$). The subsequent growth of layers, 24 to 28, may be also carried out by the OMVPE method at a temperature of 650° C.

(Electrode Formation)

Finally, on the contact layer 28 and in the back surface 12a of the substrate 12 are formed with electrodes, 30 and 32, respectively. Thus, the light-emitting device 10 according to the present invention may be obtained. The process of the present embodiment buries the active region 18 within the grooves 44, which may escape the active region 18 from being processed by the dry-etching, accordingly, may reduce the plasma damage induced in the active region 18, thereby suppressing the generation of the non-radiative recombination center. Thus, the semiconductor layer 16a is preferable to be un-doped to suppress the inner loss due to the impurities contained therein.

Third Embodiment

Figure 8:
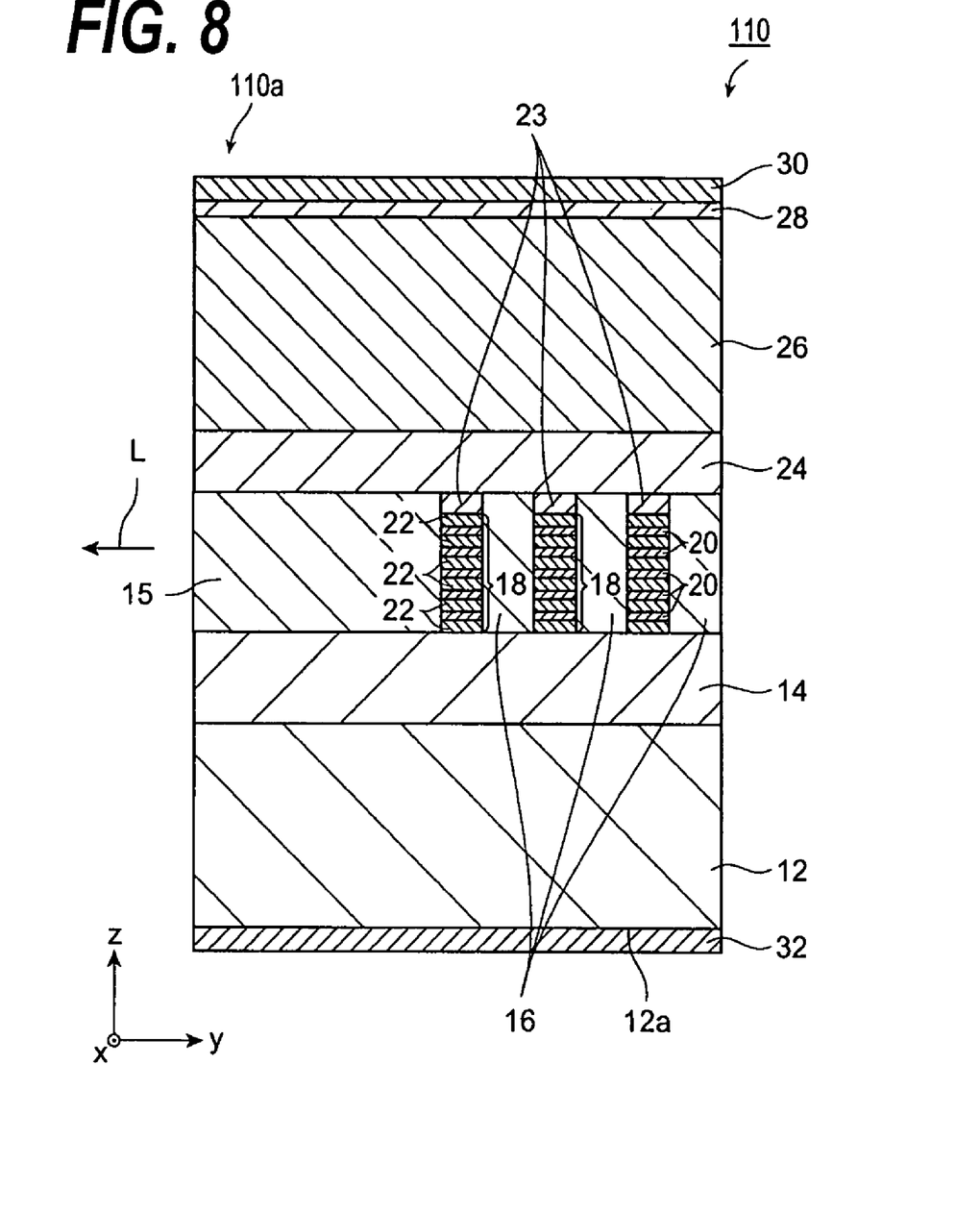
FIG. 8 is a side cross section of a light-emitting device according to a third embodiment of the present invention.

A light-emitting device according 110 to third embodiment of the invention provides an active region that includes AlGaInAs and an additional layer 23 made of group III-V compound semiconductor material between the active region 18 and the optical confinement layer 24 to prevent the oxidization of aluminum (Al) contained within the active region. The additional layer 23, involved within the mesa structure m, may be i-GaInAsP. The active region 18 may includes well layers and barrier layers each comprised of i-AlGaInAs but different compositions to each other; or the active region may include i-AlGaInAs layers for the well layer 20, while i-GaInAsP layers for the barrier layer 22. Because the device 110 provides the additional layer 23 to prevent the oxidization of the AlGaInAs layer included within the active region 18, the device may enhance the reliability as well as the performance thereof.

Figure 9:
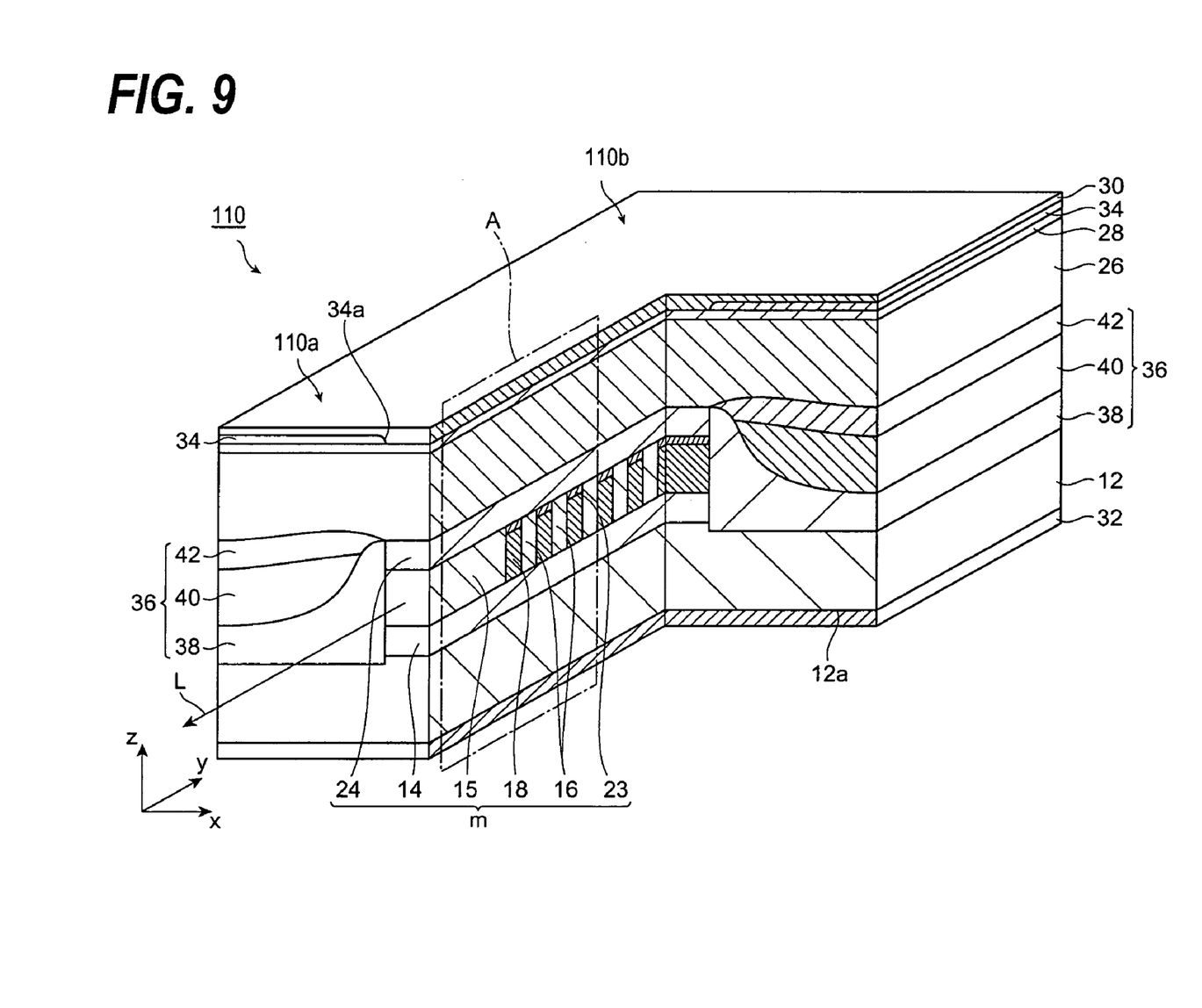
FIG. 9 is a perspective view of the light-emitting device according to the third embodiment of the invention, a portion of which is cut away to show a cross section of the active region.

The light-emitting device 110 may further provide a window region 15 in an edge portion 110a thereof to emit light L generated in the active region 18 as shown in FIG. 9. The edge portion 110a may prevent the device, in particular, the edge thereof from degrading. The edge portion 15 may be formed without using conventional techniques such as the ion-implantation; accordingly, the device shows a superior performance without the increase of the threshold current and the decrease of the differential quantum efficiency due to the increase of the inner loss of the device. The window region 15 is, sandwiched between the optical confinement layers, 14 and 24, adjacent to the grating region, and may be the same group III-V compound semiconductor material as that of the semiconductor regions 16. The device 110 may provide a reflective coating in the other end of the device to reduce the reflection loss.

Next will describe a process for manufacturing the device shown in FIGS. 8 and 9. The process to be described is different from the process already described for the device according to the first embodiment in points that the device 110 provides the additional layer 23 and the window region in the edge portion 15 thereof.

Figure 10A:
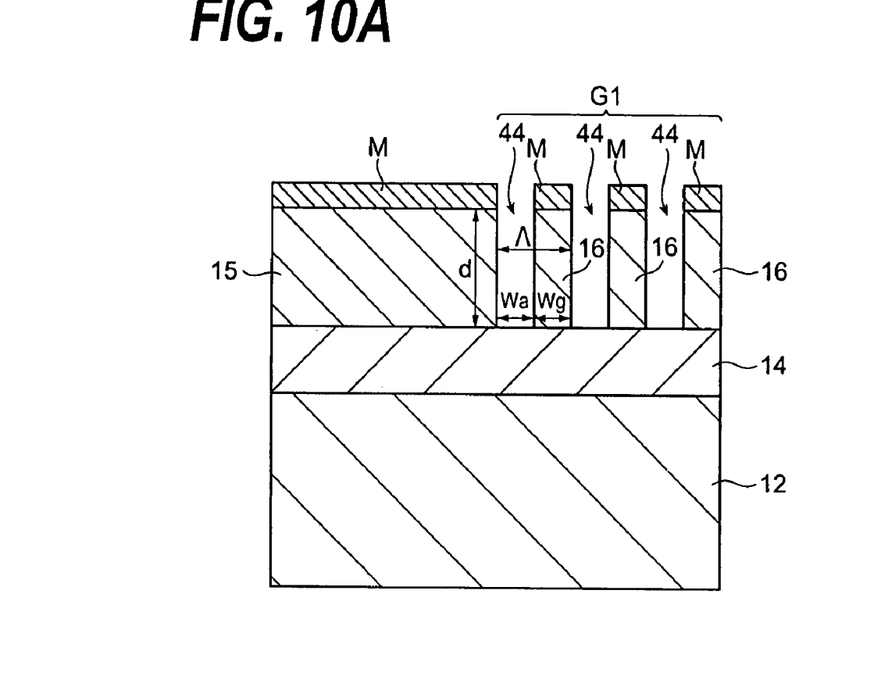
FIG. 10A shows a process for manufacturing the light-emitting device, where the semiconductor regions are etched away to form a periodic grooves.

In the dry-etching process after the formation of the etching mask, the width Wa of the grooves 44, which is along the direction of an optical axis of the device 110, is preferable between 90 nm and 100 nm. The grooves 44 are formed with a preset pitch Λ, which is a sum of the width Wa of the groove 44 and the width Wg of the semiconductor region 16. For the device with the emission wavelength of 1.3 μm, the pitch Λ may be 200 nm, while, the device emits light with 1.55 μm, and the pitch Λ becomes 240 nm. The depth d of the grooves 44 automatically becomes equal to a thickness of the semiconductor regions 16, and is preferably greater than 40 nm from a point that the active region 18 may be thick. The dry-etching to form the semiconductor region 16 may automatically form the window region 15, which forms the grooves 44 and the window region 15 in the same time. Thus, the process may be simplified; accordingly, the process cost may be reduced.

Subsequent to the dry-etching of the semiconductor regions 16, the active region 18 including AlGaInAs is buried within the grooves 44 by the selective growth using the etching mask M. Alternate growth of the barrier layers 22 and the well layers 20 forms the active region 18 within the grooves 44 with a growth rate of 250 nm/hour at a growth temperature of 700° C.

Figure 10B:
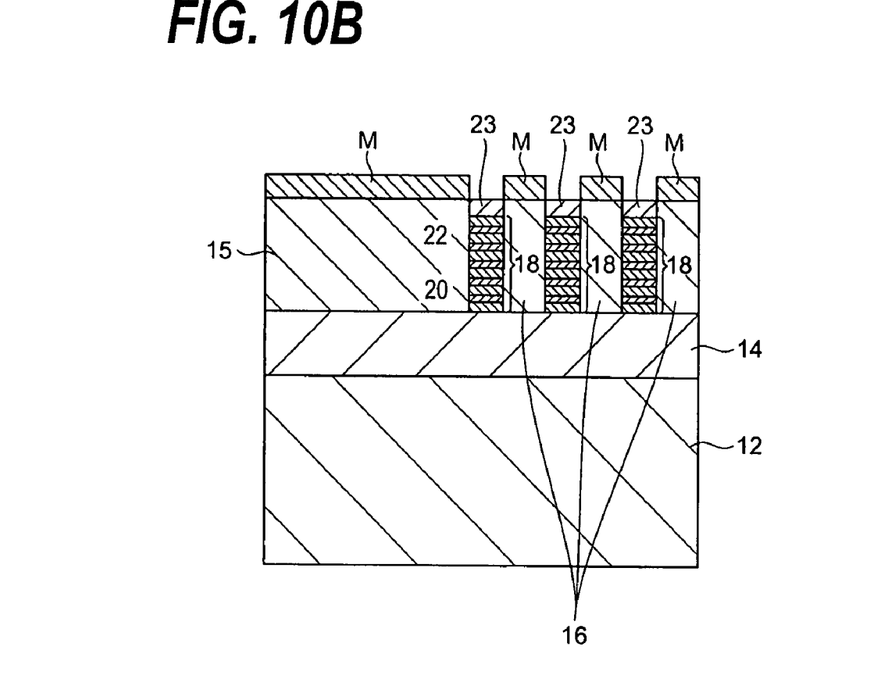
FIG. 10B shows a process, subsequent to the process shown in FIG. 10A, to bury the periodic grooves with the active regions.

As shown in FIG. 10B, after the formation of the active region 18, the additional layer 23 is selectively grown only on the top layer of the active region 18 without removing the etching mask M. The additional layer 23 prevents the top of the active region 18 from oxidizing. These selective growths of layers, 20, 22 and 23, may be carried out by the Organic Metal Vapor Phase Epitaxy (OMVPE) method.

Fourth Embodiment

Figure 11:
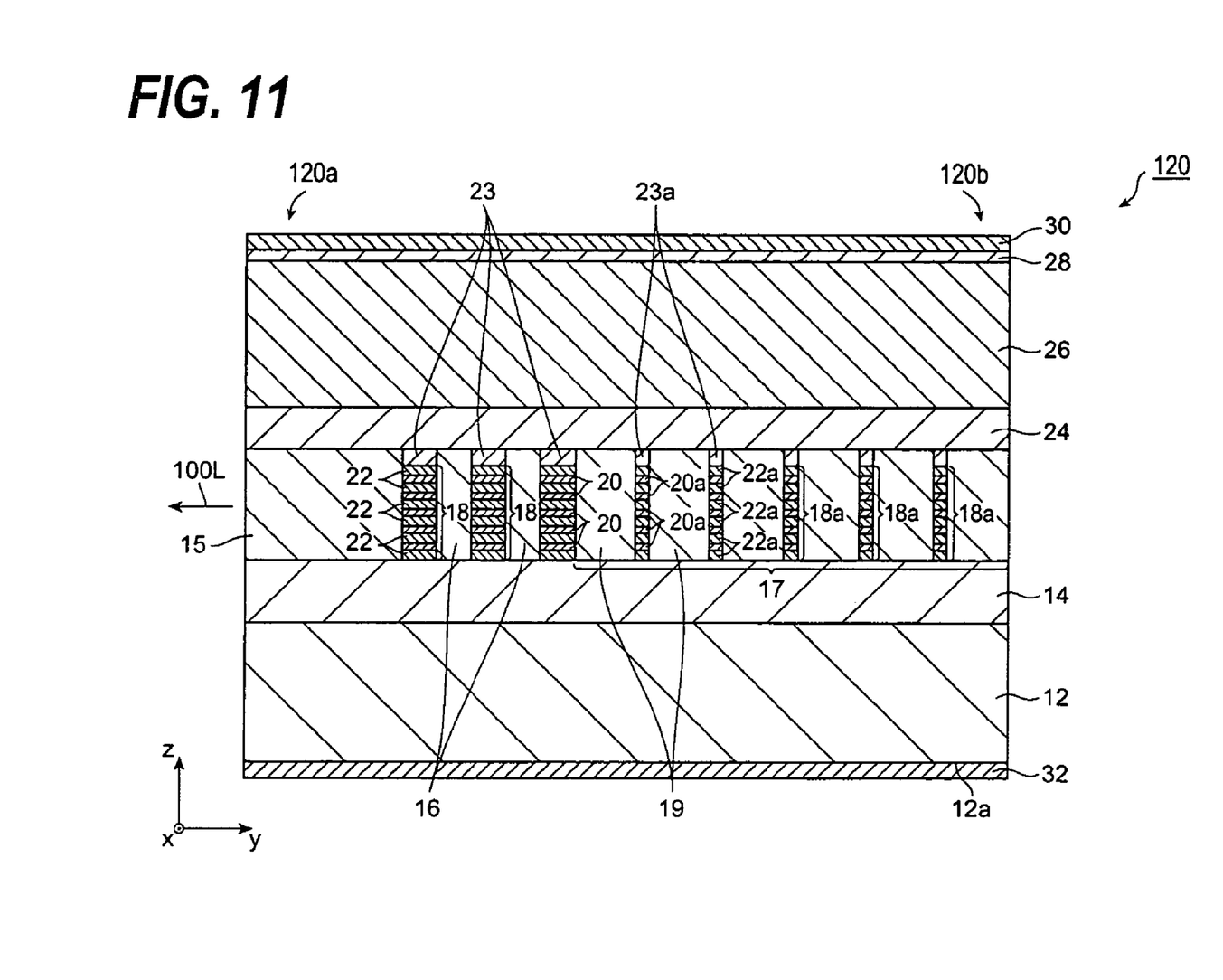
FIG. 11 is a side cross section of a light-emitting device according to fourth embodiment of the invention.

Next, a fourth embodiment of the light-emitting device according to the present invention will be described. FIG. 11 is a side cross section of the light-emitting device 120 of the fourth embodiment, which is a type of distributed feedback (DFB) laser diode.

The device 120 that emits light along the y-axis includes, similar to the previous embodiments, the substrate 12 made of a group III-V compound semiconductor material, two optical confinement layers, 14 and 24, semiconductor regions 16, the active regions 18, the additional layer 23 to prevent the oxidization of the active region 18, the semiconductor layer 26 that functions as the cladding layer, the contact layer 28 and two electrodes, 30 and 32.

The device 120 also provides the window region 15 in the end portion 120a thereof from which the laser light 100L emits. On the other hand, the other end portion 120b provides a distributed Bragg reflector (DBR) 17 to reflect light 100L. The DBR 17 may omit the coating the end 120b of the device with a reflection film.

The DBR 17 includes a plurality of semiconductor regions 18a and a plurality of other semiconductor regions 19, which is made of a group III-V compound semiconductor material, arranged in alternate to each other. The region 18a, including AlGaInAs in the present embodiment, may be configured with a quantum wire structure. While, the regions 19, which are sandwiched by two optical confinement layers, 14 and 24, and arranged adjacent to the DFB grating, may be the same material with the regions 16.

Between the regions 18a and the optical confinement layer 24 is formed with a semiconductor layer 23a which also prevent the oxidization of the regions 18a, in particular, the oxidization of AlGaInAs constituting the region 18a. The layer 18a may be the same material with that of the layer 18. The device 110, as well as preventing the oxidization of AlGaInAs within the active region 18 by the layer 23, may reduce the reflection loss by providing the DBR 17, which reduces the threshold current of the device 110 and enhances the emission efficiency.

Figure 12:
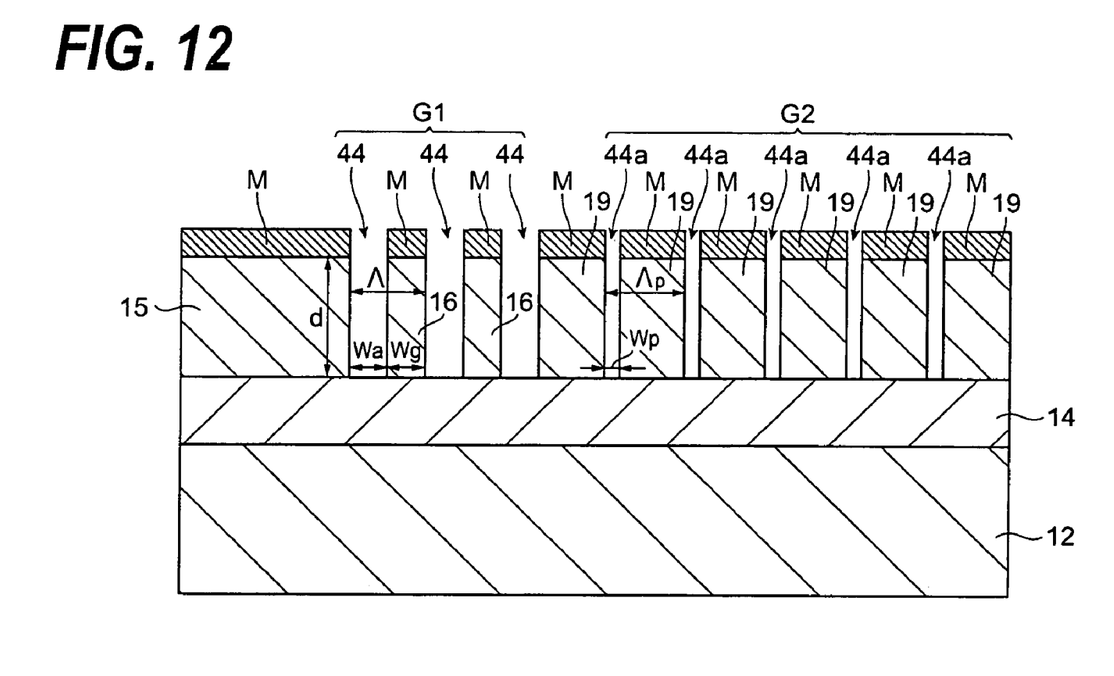
FIG. 12 shows a process for manufacturing the device shown in FIG. 11, in which the semiconductor region is etched away to form two types of periodic grooves, one is for the DFB structure and the other is for the DBR.

A process for manufacturing the device 120 will be described as comparing the processes already described for previous embodiments. In the present process, the dry-etching may carry out the formation of the DBR as shown in FIG. 12. The dry-etching forms, at a same time, two types of periodic structures, G1 and G2, the former including grooves 44 and the latter including grooves 44a. One of periodic structures, G1, is for the DFB structure and the other G2 is for the DBR, in a same time. Because two types of grooves, 44 and 44a, may be formed in the same time, the process may be simplified and the cost thereof may be reduced.

The width Wp of the groove 44a in the structure G2, preferably from 20 nm to 40 nm, is narrower than the width Wa of the groove 44 in the structure G1, which may realize the quantum wire structure in G2. The grooves 44a in the region G2 have a preset pitch Λp such that the DBR in the region G2 shows a large reflectivity. The pitch Λp is unnecessary to be equal to the pitch Λ in the region G1.

Subsequent to the dry-etching, the active region 18 that includes AlGaInAs buries the grooves 44 by the selective growth using the etching mask M, and at the same time, the grooves 44a are also buried by the same material with the active region 18 to form the DBR 17. Next, the semiconductor layer 23 to prevent the oxidization of the top of the active region 18 is buried within the grooves 44. At the same time, the other grooves 44a are also buried by the layer 23. Thus, the process to form the device 120 is almost the same with the process aforementioned except that the dry-etching carries out the formation of the DBR region G2 in addition to the G1. However, only arranging the etching mask M may form the region G2, the process according to the present embodiment may be quite simplified even though the device to be formed is complex.

The present invention thus described based on preferred embodiments thereof as referring to drawings, the invention is not restricted to those embodiments. For instance, the light-emitting device 10 may be a light-emitting-diode (LED), a laser diode of a Fabry-Perot type with the quantum wire structure, a laser diode with the quantum box structure and a laser diode of a vertical cavity surface emitting laser type with the quantum wire or the quantum box structure. Further, the light-emitting device may exclude the optical confinement layers, 14 and 24.

While the description above refers to particular embodiments of the present invention, it will be understood that many modifications may be made without departing from the spirit thereof. The accompanying claims are intended to cover such modifications as would fall within the true scope and spirit of the present invention. The disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

I claim:

1. A method for manufacturing a semiconductor light-emitting device, comprising steps of:
    forming a semiconductor layer on a semiconductor substrate, the semiconductor substrate being made of a first group III-V compound semiconductor material and the semiconductor layer being made of a second group III-V compound semiconductor material;
    forming an etching-mask on the semiconductor layer;
    forming a first periodic structure in the semiconductor layer by dry-etching the semiconductor layer using the etching-mask, the first periodic structure including a plurality of first grooves with a first width and a plurality of first mesas sandwiched by the first grooves;
    dipping the substrate and the semiconductor layer into an etchant to etch a surface of the semiconductor layer slightly to smooth the grooves; and
    selectively forming active regions made of third group III-V compound semiconductor material so as to bury the plurality of grooves.

2. The method according to claim 1, wherein the step for forming the plurality grooves is carried out such that a width of the groove is equal to or narrower than a width of a mesa formed between the grooves.

3. The method according to claim 1, wherein the step for selectively forming the active region includes a step for forming a multiple quantum well structure in the active region.

4. The method according to claim 1, wherein the step for selectively forming the active region is carried out such that a growth rate of the active region is set between 200 nm to 500 nm per hour.

5. The method according to claim 1, wherein the step for forming the semiconductor layer is carried out such that the semiconductor layer includes indium as a group III element, and wherein the step for forming the grooves is carried out by dry-etching the semiconductor layer using a gas including methane and hydrogen.

6. The method according to claim 1, wherein the step for forming the grooves is carried out such that the grooves and the mesas between the grooves form an optical grating.

7. The method according to claim 1, wherein the step for forming the active region is carried out such that the active region configures a quantum wire structure or a quantum box structure.

8. The method according to claim 1, wherein the step for selectively forming the active region includes steps of:

selectively forming an active layer including AlGaInAs so as to bury the grooves, and selectively forming a semiconductor layer made of a fourth group III-V compound semiconductor material on the active layer, wherein the semiconductor layer provided on the active layer prevents oxidization of the active layer.

9. The method according to claim 1, wherein the second group III-V semiconductor material of the second semiconductor layer includes GaInAsP and the etchant to etch the surface of the second semiconductor layer includes sulfuric acid.

10. The method according to claim 1, wherein the second group III-V semiconductor material of the second semiconductor layer includes InP and the etchant to etch the surface of the second semiconductor layer includes sulfuric acid.

11. The method according to claim 3, wherein the quantum well structure includes a plurality of well layers and a plurality of barrier layers alternately stacked to each other.

12. The method according to claim 8, wherein the step for forming the grooves forms a window region in an edge portion of the light-emitting device.

13. The method according to claim 12, wherein the step for forming the grooves includes a step of forming a region for a distributed Bragg reflector in the other edge portion of the light-emitting device, wherein the region for the distributed Bragg reflector provides a second periodic structure in the semiconductor layer made of the second group III-V compound semiconductor material, the second periodic structure including a plurality of second grooves with a second width and a plurality of second mesas alternately sandwiched by the second grooves, the second width being smaller than the first width of the first grooves, and wherein the step for selectively forming the active region within the first grooves forms the distributed Bragg reflector in the other edge portion by burying the second grooves with AlGaInAs that constitutes the active layer simultaneously with the burying of the first grooves.

* * * * *